(12) United States Patent
Carr et al.

(10) Patent No.: US 6,930,387 B2
(45) Date of Patent: Aug. 16, 2005

(54) DICING TAPE AND DIE EJECTION METHOD

(75) Inventors: Dustin W. Carr, Albuquerque, NM (US); Flavio Pardo, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 190 days.

(21) Appl. No.: 10/348,638

(22) Filed: Jan. 22, 2003

(65) Prior Publication Data

US 2004/0140532 A1 Jul. 22, 2004

(51) Int. Cl.⁷ .............................................. H01L 23/12
(52) U.S. Cl. ...................... 257/731; 257/678; 257/778; 438/460
(58) Field of Search ................................. 257/731, 730, 257/678, 778; 438/460

(56) References Cited

U.S. PATENT DOCUMENTS

| 4,472,218 A | 9/1984 | Avedissian et al. ............ 156/64 |
| 5,098,501 A | 3/1992 | Nishiguchi ............... 156/275.5 |
| 5,494,698 A | 2/1996 | White et al. ................. 427/295 |
| 6,175,162 B1 * | 1/2001 | Kao et al. .................... 257/787 |
| 6,248,648 B1 | 6/2001 | McKenna et al. .......... 438/464 |
| 2004/0158008 A1 * | 8/2004 | He et al. ....................... 526/72 |

OTHER PUBLICATIONS

GDSI: Grinding & Dicing Services, Inc. Tape Products, www.wafergrind.com/tape-products.htm, Nov. 8, 2002, pp 1-2.

LINTEC, Dicing Tape, D-series, G-series, www.lintec-.co.jp/e-dept/english/adwill/dicetape.html, Nov. 8, 2002, pp 1-2.

Xenon, UV Curable Dicing Tape, Zero Residue, www.x-enon-corp.com/semicon.html, Nov. 8, 2002, pp 1-2.

* cited by examiner

Primary Examiner—Brad Smith

(57) ABSTRACT

A tape assembly for use in wafer dicing includes a layer of adhesive dicing tape having a size at least as large as a footprint of a die, and a screening portion which is adhered to the tape. The screening portion is interposed between the layer of tape and the die when the die is adhered to the layer of tape. The screening portion covers an interior portion of the layer of tape. The screening portion is sized and shaped to leave a sufficient portion of the layer of tape underlying a perimeter of the die exposed to adhere the die to the layer of tape.

17 Claims, 8 Drawing Sheets

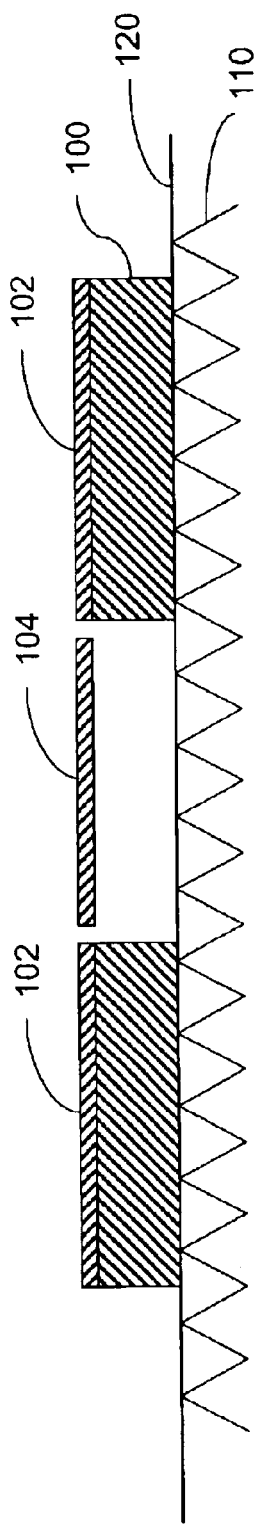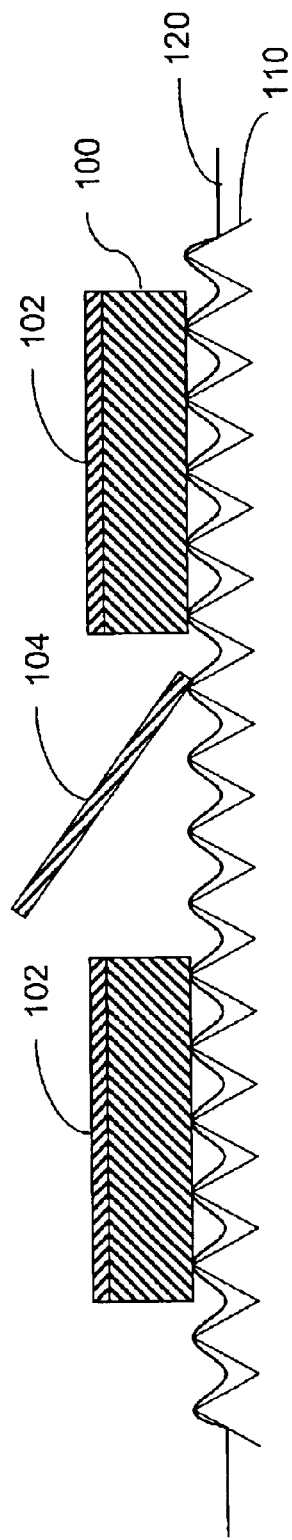

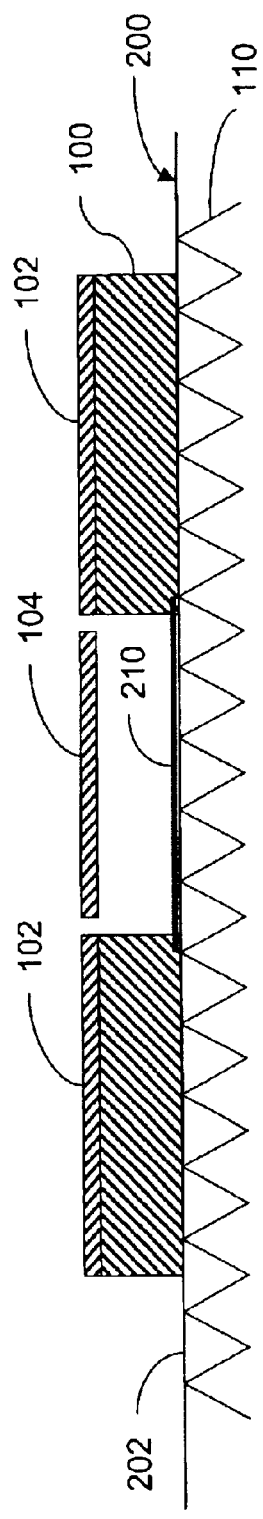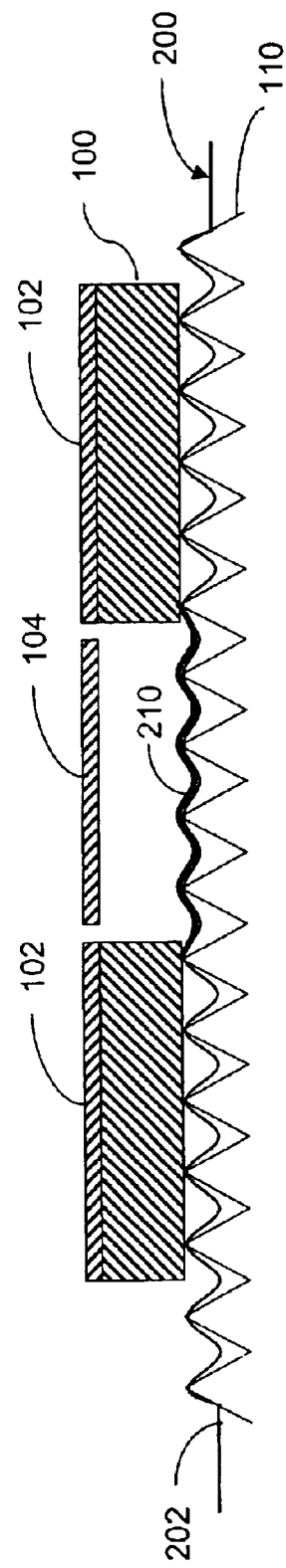

DICING TAPE AND DIE EJECTION METHOD

FIELD OF THE INVENTION

The present invention relates to the field of integrated circuit fabrication generally, and more specifically to separation of dies from semiconductor wafers.

BACKGROUND

During integrated circuit fabrication, a plurality of integrated circuits (dies) are formed on a single semiconductor wafer simultaneously by a series of material deposition and removal processes. The individual dies are then separated from the wafer, in a process called dicing. Typical wafer dicing involves attaching the wafer to an adhesive dicing tape, followed by separation of the dies from each other and the wafer. Separation is typically achieved by dicing with a circular saw or by scribing and breaking the wafer (if the wafer is crystalline). If the dies contain micro electromechanical systems (MEMS), the latter method is typically used, because use of a saw would produce too many particles that could interfere with the device. Even using the scribe-and-break technique, the die ejection process from the tape is non-trivial.

FIG. 1 shows a die 100 including a MEMS structure 104. The exemplary MEMS 104 is a mirror attached to the die 100 which pivots about an axis 106 under control of the circuitry 102, and is also connected to the die by a plurality small springs, not shown. The springs (not shown) bias the mirror to the horizontal position of FIG. 2. The MEMS 104 may be, for example, a mirror sized between about 200 microns and 300 microns, connected to the outer portion of the die 100 by 2 springs (not shown). Although an example of a mirror is described, this discussion applies equally to other types of MEMS with at least one moving part.

A common die-ejection procedure includes placing the adhesive tape holding the dies on top of a base that includes an array of sharp-pointed pyramid-shaped structures. A vacuum is applied between the tape and the base. The tape is thus pulled down, minimizing the contact area with the die and facilitating its removal. An example of such a machine is a Model 4800 Die Ejection Grid machine manufactured by Semiconductor Equipment Corp. of Moorpark, Calif.

FIG. 2 shows a cross section of the die 100 of FIG. 1. The die 100 is attached to dicing tape 120, which is placed on the base 110 having pyramid-shaped structures.

During the ejection procedure, the tape 120 charges up due to charge separation at the interface and the electrostatic force on the MEMS device 104 can attract the moving part of the MEMS, resulting in the moving part becoming irreversibly stuck to the adhesive tape, as shown in FIG. 3. When the die 100 is subsequently removed from the tape 120, the MEMS 104 remains on the tape, rendering the die useless.

Although ultraviolet (UV) curable dicing tape has been developed to release items attached thereto upon curing the tape, even UV curable tapes retain a small amount of adhesion after exposure to UV radiation. This is enough to tear the MEMS 104 away from the outer portion 100 of the die.

Another attempt at protecting the MEMS involved the use of "anti-static" tapes. However, because of the small spring constant of the springs (not shown), the anti-static tapes may still develop enough charge to draw the MEMS to the tape.

In addition to the static electric charge, the sudden displacement of the tape 120 upon application of the vacuum can create an air flow (referred to herein as the "pneumatic effect") that tends to move the movable part 104 of the MEMS into contact with the tape 120.

Improved techniques are desired.

SUMMARY OF THE INVENTION

A tape assembly for use in wafer dicing includes a layer of adhesive dicing tape having a size at least as large as a footprint of a die, and a screening portion which is adhered to the tape. The screening portion is interposed between the layer of tape and the die when the die is adhered to the layer of tape. The screening portion covers an interior portion of the layer of tape. The screening portion is sized and shaped to leave a sufficient portion of the layer of tape underlying a perimeter of the die exposed to adhere the die to the layer of tape.

BRIEF DESCRIPTION OF THE DRAWINGS

FIG. 2 is a cross sectional view of the integrated circuit of FIG. 1, taken along section line 2—2, with the circuit adhered to a dicing tape on a vacuum base.

FIG. 3 shows the integrated circuit of FIG. 2, with the MEMS stuck to the dicing tape.

FIG. 4 shows an exemplary circuit and tape assembly having a screening member.

FIG. 5 shows the assembly of FIG. 4 after application of a vacuum.

DETAILED DESCRIPTION

Figure 1:
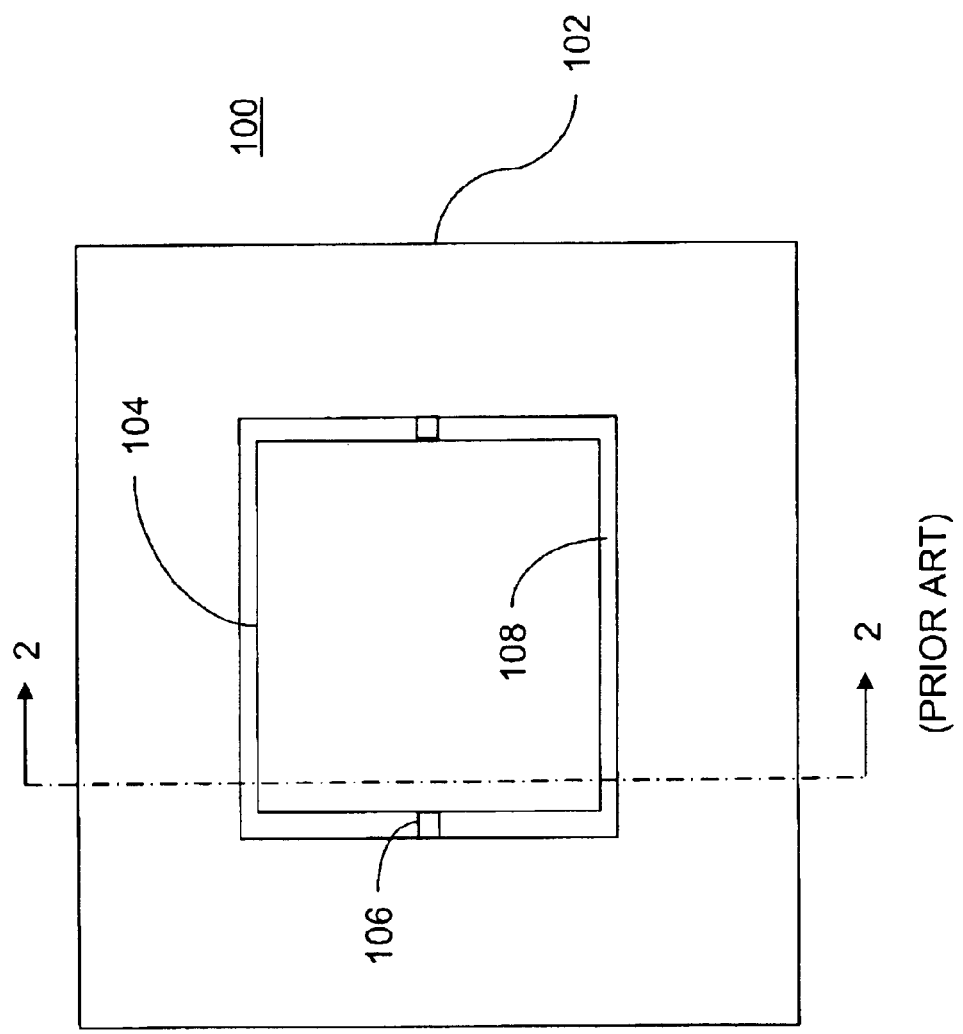
FIG. 1 is a plan view of a conventional integrated circuit having a micro electro-mechanical system (MEMS) thereon.

This description of the preferred embodiments is intended to be read in connection with the accompanying drawings, which are to be considered part of the entire written description of this invention. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term micro-electromechanical systems (MEMS) device as used herein is intended to mean an entire MEMS device or any portion thereof. Thus, if a portion of a MEMS device is inoperative, or if a portion of a MEMS device is occluded, such a MEMS device is nonetheless considered to be a MEMS device for purposes of the present disclosure.

Figure 6:
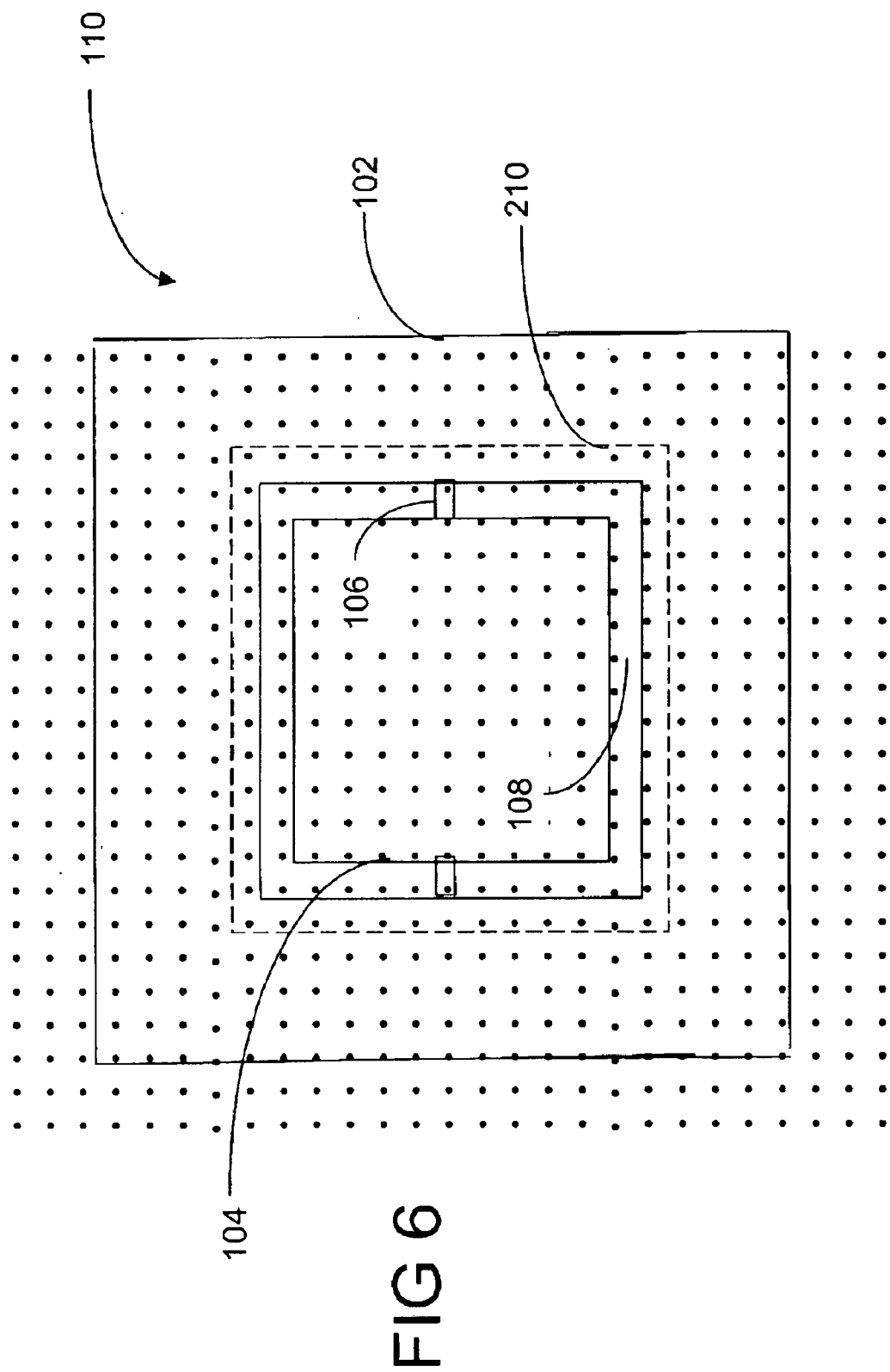
FIG. 6 is a plan view showing the assembly of FIG. 4.

FIGS. 4–6 show an exemplary apparatus and method for separating a die 100 from a tape assembly 200 that is used in wafer dicing. The tape assembly 200 includes a layer of adhesive dicing tape 202 having a size at least as large as a footprint of a die, and a screening portion 210 which is adhered to the tape. The screening portion 210 is positioned on the tape 202 so that the screening portion 210 is interposed between the layer of tape and the die 100 when the die 100 is adhered to the layer of tape. The screening portion 210 may (but is not required to) include a conductive membrane covering an interior portion of the layer of tape 202. The screening portion 210 is sized and shaped to leave a substantial portion of the layer of tape 202 underlying a perimeter of the die 100 exposed when the die is adhered to the layer of tape. Thus, the screening portion 210 does not interfere with adhering the die 100 to the tape 202.

In the example of FIG. 6, the screening portion 210 is a square conductive membrane having a length that is slightly greater than the length of the opening 108 surrounding the MEMS 104. Preferably, the screening portion 210 is formed of a material that is thick enough to substantially increase the stiffness of a portion of dicing tape 202 to which the screening portion is adhered, but thin enough so as not to interfere with adhesion between surrounding portions of the tape 202 and the perimeter of the die 100. Materials that are at the thicker end of this material-thickness window are also more likely to be re-usable in a manner such as described further below. An exemplary material for the screening portion 210 is a metal foil 10 to 25 microns thick, which may be chrome, aluminum or copper, for example.

The tape 202 can be any tape suitable for dicing. An exemplary tape is No. 1020 UV-curable adhesive polyvinyl chloride (PVC) tape, sold by Ultron Systems Inc. of Moorpark, Calif. A similar tape product (Adwill D-Series Tape) is available from Lintec Semiconductor of Tokyo, Japan. UV curable tapes are advantageous because, once cured, removal of the die 100 and/or the screening portion 210 from the tape 202 is facilitated. Where different levels of adhesion or tackiness are available, tapes having higher tackiness are advantageous, because they facilitate adhesion between the die 100 and the tape 202, even with a portion of the tape blocked by the screening portion 210. General dicing tapes that are not UV curable, and dicing tapes having lower tackiness may also be used.

The shape of the screening portion may depend on the shape of the MEMS 104 on the die 100. For example, given a square mirror 104 as shown in FIGS. 4–6, a square screening portion 210 larger than the mirror 104 (and larger than the space 108 surrounding the mirror), but smaller than the die 100 is suitable. For a circular MEMS (not shown), a circular screening portion (not shown) having a diameter greater than the diameter of the MEMS (and optionally greater than the diameter of the space surrounding the MEMS) may be used.

Other shapes that are at least as large as the footprint of the MEMS 104 may also be used. For example, given the square mirror 104, a screening portion 210 may be, for example, a rectangle having both sides greater than that of the space 108 surrounding the MEMS, or a circle having a radius at least as large as the diagonal of the space 108.

The exemplary screening portion 210 has three effects on the tape removal process. The first effect is that the addition of the screening portion 210 makes the tape assembly 200 stiffer locally under the MEMS 104, so that there is reduced movement of the portion of the tape 202 beneath the MEMS. This in turn reduces or eliminates the pneumatic effect, so that the MEMS 104 is less likely to contact the tape assembly 220. Second, if screening portion 210 is conductive, the MEMS 104, the electrical attraction between the MEMS 104 and the tape 202 is reduced or eliminated, in addition to the pneumatic effect. Without being bound to any particular theory, this may be because the MEMS is completely screened from any static charge in the tape 202, or because charge beneath the MEMS is shunted towards the perimeter of the die. The third effect is that the screening portion 210 presents a non-adhesive surface directly beneath the MEMS 104. Even if the MEMS 104 ever contacts the screening portion 210, the MEMS 104 does not adhere to the screening portion.

In alterative embodiments, the screening portion 210 may be formed of a non-conductive material. Such embodiments would not, however, shunt the static charge in the tape away from the MEMS as the exemplary conductive membrane does.

Figure 7:
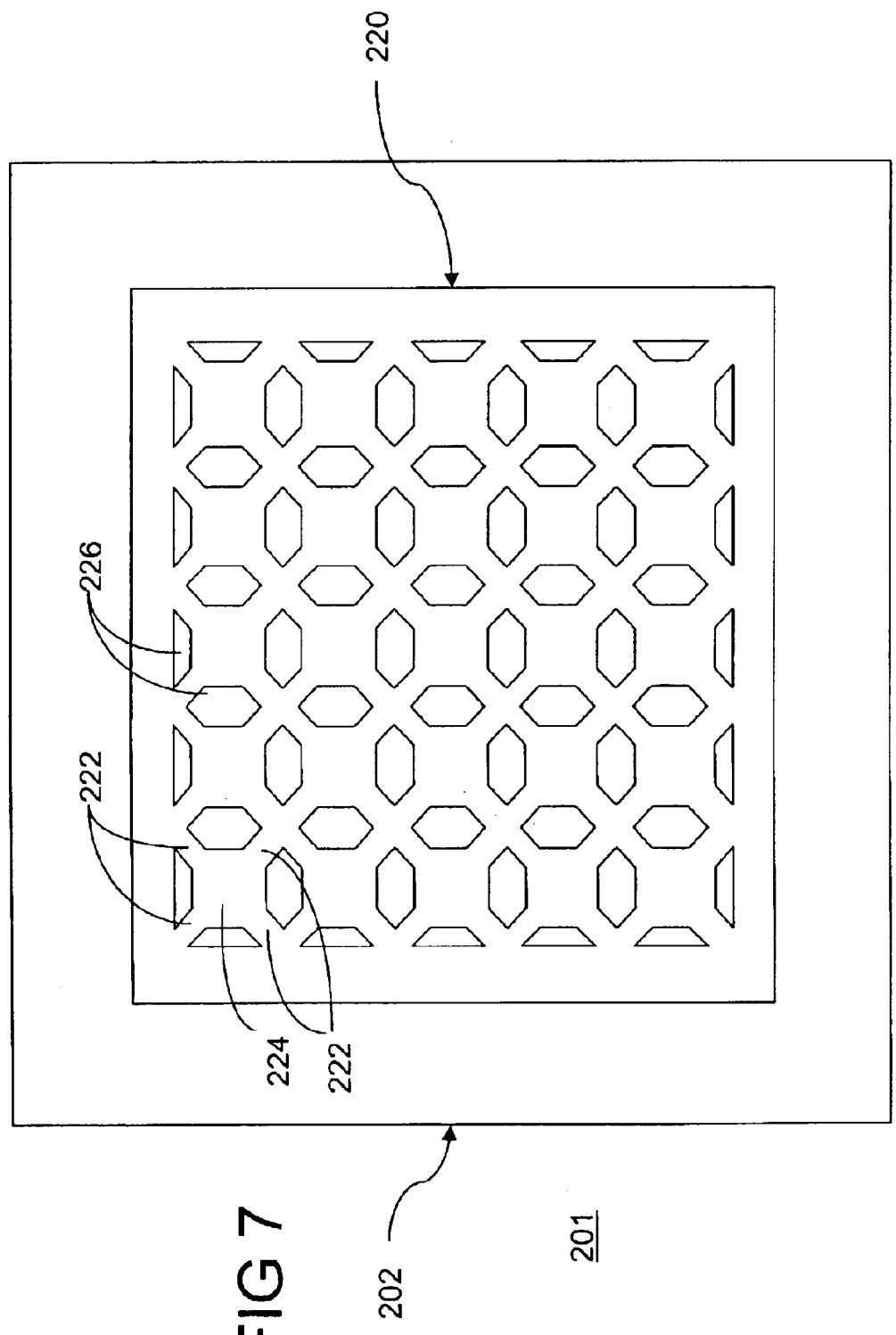
FIG. 7 is a plan view of a patterned sheet of screening membranes.
Figure 8:
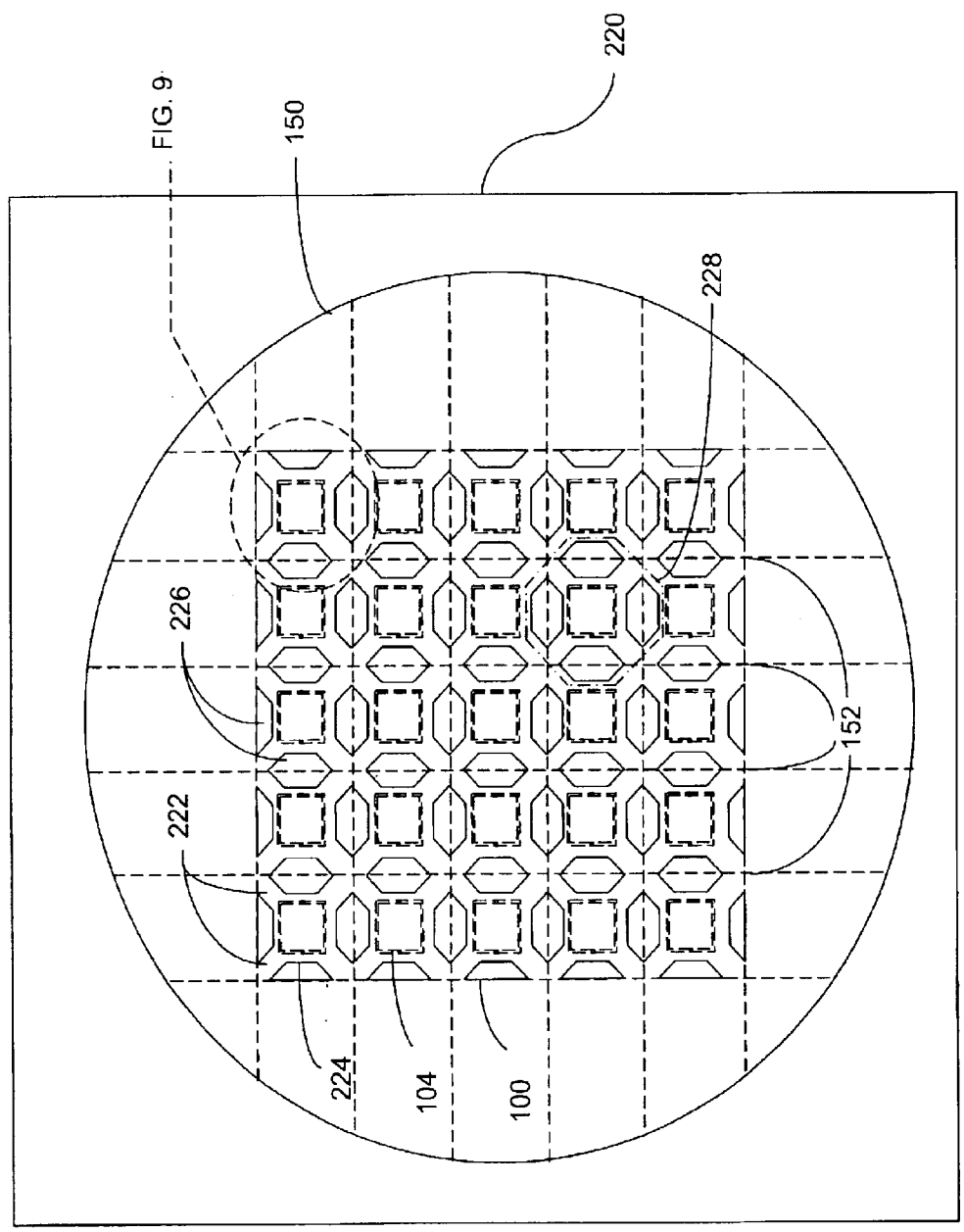
FIG. 8 is a bottom plan view of the sheet of FIG. 7, looking up towards the wafer behind the sheet.
Figure 9:
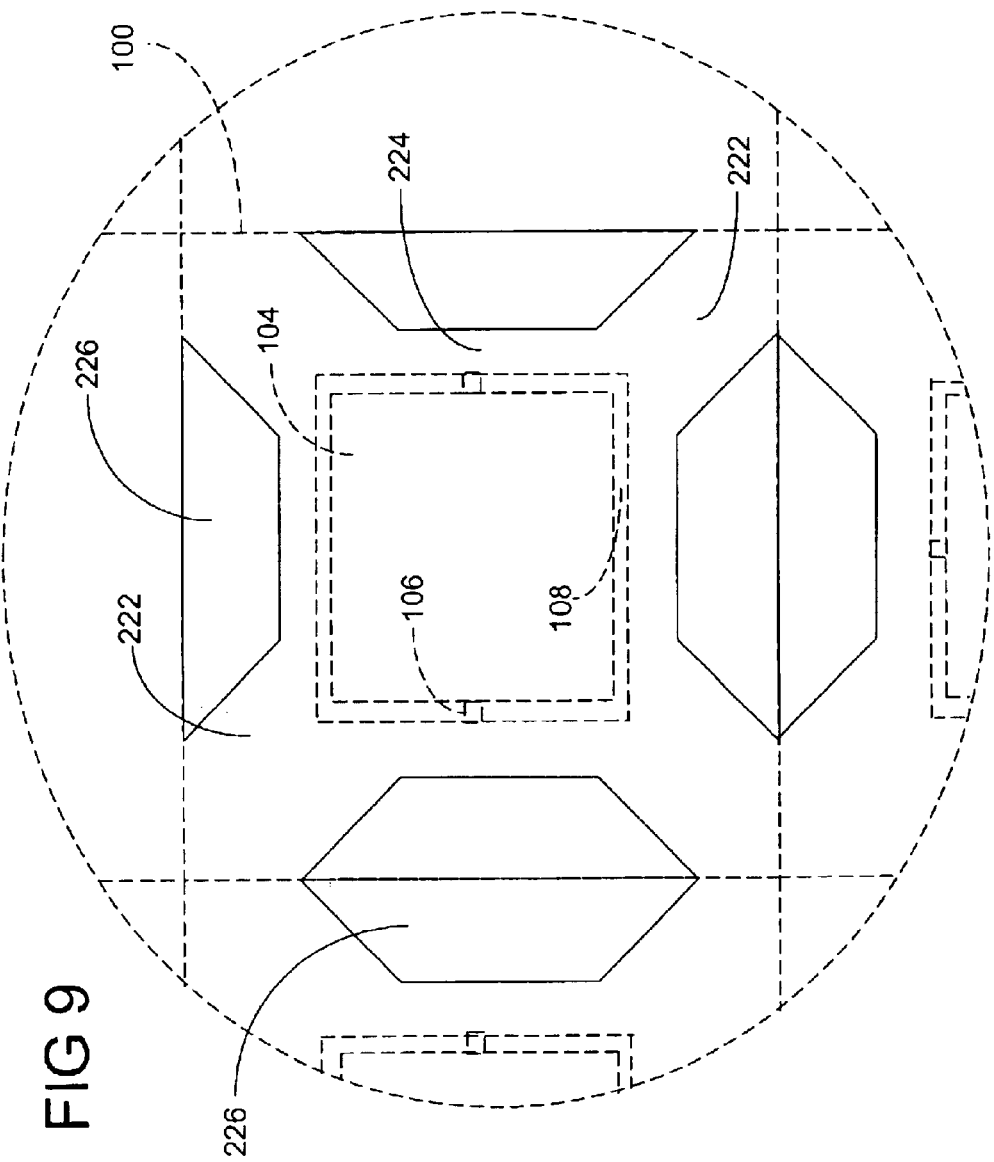
FIG. 9 is an enlarged detail of FIG. 8.

In some embodiments, an individual screening portion 210 is positioned on the tape 202 at a respective position to underlie a respective die on a wafer when the wafer is adhered to the tape, as shown in FIGS. 4–6. A plurality of individual screening portions (not shown) may be affixed to the tape in the same manner. FIGS. 7–9 show another embodiment, in which a plurality of screening portions 224 are joined together in a single sheet 220. The plurality of screening portions 224 correspond to dies on a wafer 150.

FIG. 7 shows the tape assembly 201, including dicing tape 202 and a patterned sheet 220. The tape 202 may be one of the types described above, and the patterned sheet 220 may be formed of the same conductive membrane materials described above with reference to the screening portion 210. The layer of tape 202 has a size at least about as large as a footprint of a die-containing portion of a wafer 150 from which the dies 100 are cut. In the example, the tape 202 is as large as the footprint of the entire wafer.

The patterned sheet 220 has a plurality of screening portions 224, which are adhered to the tape 202. The patterned sheet has a plurality of cutouts 226, which leave a substantial portion of the perimeter (as a fraction of total perimeter length) of each of the plurality of dies 100 exposed when the wafer 150 is adhered to the layer of tape (FIG. 8). The dies 100 and the scribe lines 152 between the dies are shown in phantom. The screening portions 224 are connected to each other and to the perimeter of the patterned sheet 220 by a plurality of connecting portions 222.

Although the example of FIG. 7 shows four connecting portions 222 connected to each screening portion, any number of connecting portions may be used. Although the exemplary connecting portions 222 are located at the four corners of each screening portion 224, the connecting portions may alternatively be located along the sides of the screening portions. Although the interior cutouts 226 are hexagons and the exterior cutouts are trapezoids, other cutout shapes may be used. With the cutouts 226, the exemplary patterned sheet resembles a stencil. Although FIG. 7 shows a wafer having five dies in each row and five dies in each column, a patterned sheet can be developed to with an appropriate number of screening portions corresponding to any number of dies on a wafer (e.g., 36 screening portions per patterned sheet).

As shown in FIGS. 8 and 9, the patterned sheet 220 can be interposed between the layer of tape 202 and the wafer 150 when the wafer is adhered to the layer of tape. The wafer 150 has a die-containing portion with a plurality of integrated circuit dies 100. FIG. 8 shows the view from a vantage point between the tape 202 and the patterned sheet 220 (i.e., looking towards the bottom surface of the wafer. Each screening portion 224 is shaped and positioned to underlie an interior portion of a respective one of a plurality of dies 100 on the wafer 150 when the wafer is adhered to the layer of tape 202. In FIG. 8, each of the dies 100 includes a respective MEMS thereon, but this is not a requirement.

The connecting portions 222 occupy a relatively small fraction of the perimeter of each die 100, so as to not interfere with adhesion between the tape 202 and the perimeter of each of the plurality of dies. Further, if the four cutouts 226 surrounding each respective screening portion 224 are considered to belong to a single combined cutout 228 corresponding to that one screening portion, then the connecting portions 222 occupy a relatively small fraction of that combined cutout. As a result, good adhesion between the underlying tape 202 and the wafer 150 can be obtained, even with the patterned sheet 220 interposed therebetween. Each screening portion 224 is sized and shaped to underlie an entire micro electro-mechanical system 104, while leaving a substantial portion of the layer of tape 202 underlying a perimeter of the corresponding die 100 exposed, allowing adhesion between the tape and the perimeter of each of the plurality of dies.

Although an example is provided in which every die has a MEMS, in alternative embodiments having multi-project wafer (MPW) systems, there may be MEMS on only a subset of the dies on the wafer. In a multi-project wafer, the screening portions may be placed only under the dies having MEMS.

Figure 10:
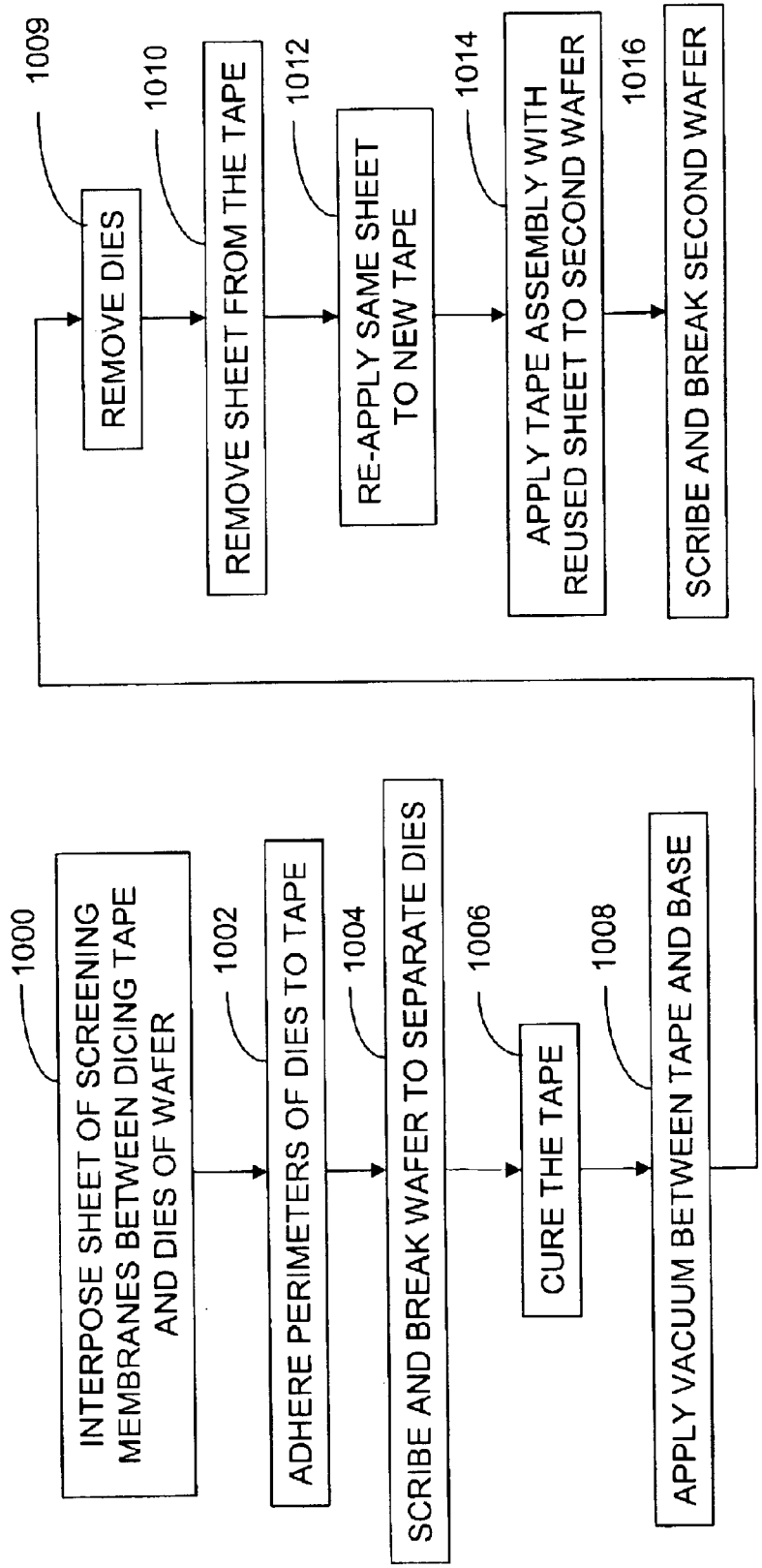
FIG. 10 is a flow chart diagram showing a method of using the sheet of FIG. 7.

FIG. 10 is a diagram of an exemplary method of using the screening portions. In this example, the screening portions are re-used. In other embodiments, the screening portions are only used once and discarded.

At step 1000, a screening portion 210 (or a patterned sheet 220 of screening portions 224) is interposed between an adhesive dicing tape 202 and an interior portion of a die 100 (or an interior portion of the wafer 150). For example, the tape 202 may be mounted (by lamination) on a dicing ring (a ring larger than the wafer). A table or a surface that supports the wafer and a roller that contacts the sheet and wafer in a uniform manner may also be used. The excess portion of the tape is cut away, and the pattern sheet 220 is then laminated onto the tape 202.

At step 1002, a perimeter of the die 100 (or of each die on a wafer 150) is adhered to the adhesive tape 202.

At step 1004, the wafer 150 is scribed and broken to separate the dies 100.

At step 1006, the tape 202 is cured. This reduces the tackiness of the tape 202 to a minimum.

At step 1008, a vacuum is applied between the tape 202 and the base 110 of the apparatus. This causes the tape 202 to pull away from the dies, towards the base 110.

At step 1009, the dies are removed from the tape 202.

At step 1010, the patterned sheet 220 (or individual screening portion(s) ) is removed from the tape 202.

At step 1012, the patterned sheet 220 is re-applied to another piece of dicing tape 202.

At step 1014, the tape assembly, with the re-used patterned sheet, is applied to another wafer.

At step 1016, the dies are separated from the second wafer.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

We claim:

1. A tape assembly for use in wafer dicing, comprising:
   a layer of adhesive dicing tape having a size at least as large as a footprint of a die; and
   a screening portion which is adhered to the tape, and which is interposed between the layer of tape and the die when the die is adhered to the layer of tape, the screening portion covering an interior portion of the layer of tape, the screening portion sized and shaped to leave a sufficient portion of the layer of tape underlying a perimeter of the die exposed to adhere the die to the layer of tape.

2. The tape assembly of claim 1, wherein the screening portion is sized and shaped to leave a substantial portion of the layer of tape underlying a perimeter of the die exposed when the die is adhered to the layer of tape.

3. The tape assembly of claim 1, wherein:
   the layer of tape has a size at least about as large as a footprint of a die-containing portion of a wafer from which the die is cut; and
   the screening portion is one of a plurality of screening portions, which are adhered to the tape, and are included in a patterned sheet which is interposed between the layer of tape and the wafer when the wafer is adhered to the layer of tape, each screening portion being shaped and positioned to underlie an interior portion of a respective one of a plurality of dies on the wafer when the wafer is adhered to the layer of tape, the patterned sheet having a plurality of cutouts which leave a substantial portion of the perimeter of each of the plurality of dies exposed when the wafer is adhered to the layer of tape.

4. The tape assembly of claim 3, wherein each screening portion is connected to the patterned sheet by a plurality of connecting portions, the connecting portions occupying a relatively small fraction of a length of the perimeter of each die, so as to not interfere with adhesion between the tape and the perimeter of each of the plurality of dies.

5. The tape assembly of claim 1, wherein the screening portions are formed of metal.

6. The tape assembly of claim 1, wherein the screening portions are formed of a conductive material.

7. The assembly of claim 1, wherein the die has a micro electro-mechanical system thereon.

8. The assembly of claim 7, wherein the screening portion underlies at least a fraction of the micro electro-mechanical system.

9. An assembly, comprising:
   a wafer having a die-containing portion with a plurality of integrated circuit dies;
   a layer of adhesive dicing tape having a size at least about as large as the die-containing portion of the wafer; and
   a plurality of screening portions which are adhered to the tape, the screening portions interposed between the layer of tape and the wafer, each screening portion being shaped and positioned to underlie an interior portion of a respective one of the plurality of dies, each screening portion sized and shaped to leave a sufficient portion of the layer of tape underlying a perimeter of the corresponding die exposed to adhere the tape to the perimeter of each of the plurality of dies.

10. The assembly of claim 9, wherein the screening portion is sized and shaped to leave a substantial portion of the layer of tape underlying a perimeter of the die exposed when the die is adhered to the layer of tape.

11. The assembly of claim 9, wherein at least one of the dies has a micro electro-mechanical system thereon.

12. The assembly of claim 11, wherein the screening portion underlies at least a fraction of the micro electro-mechanical system.

13. The assembly of claim 9, wherein the plurality of screening portions are included in a patterned sheet.

14. The assembly of claim 13, wherein the patterned sheet has a cutout underlying the perimeter of a respective one of the dies.

15. The assembly of claim 14, wherein each screening portion is connected to the patterned sheet by a plurality of connecting portions, the connecting portions occupying a relatively small fraction of the cutouts, so as to not interfere with adhesion between the tape and the perimeter of each of the plurality of dies.

16. The assembly of claim 9, wherein the screening portions are formed of a conductive material.

17. The assembly of claim 9, wherein:

the plurality of screening portions are included in a patterned sheet having a cutout underlying the perimeter of a respective one of the dies, each screening portion connected to the patterned sheet by a plurality of connecting portions, the connecting portions occupying a relatively small fraction of the cutouts, so as to not interfere with adhesion between the tape and the perimeter of each of the plurality of dies;

at least one of the dies has a micro electro-mechanical system thereon; and the screening portion underlies at least a fraction of the micro electro-mechanical system.

* * * * *